United States Patent [19]

Anderson et al.

[11] Patent Number: 4,888,600

[45] Date of Patent: Dec. 19, 1989

[54] KEYBOARD ARRANGEMENT WITH GHOST KEY CONDITION DETECTION

[75] Inventors: Frank E. Anderson, Paris; Christopher J. Gay, Lexington; Scott A. Hightower, Lexington; Karen G. Luton, Lexington, all of Ky.

[73] Assignee: International Business Machine Corp., Armonk, N.Y.

[21] Appl. No.: 149,804

[22] Filed: Jan. 29, 1988

[51] Int. Cl.[4] .......................................... H03M 11/00
[52] U.S. Cl. ........................................ 341/24; 341/26
[58] Field of Search .......... 340/365 E, 365 S, 825.79; 341/24, 285, 26, 22; 178/17 C; 400/477, 479, 480, 481

[56] References Cited

U.S. PATENT DOCUMENTS

| | | | |
|---|---|---|---|
| 3,717,871 | 2/1973 | Hatano et al. | 340/365 E |
| 3,721,976 | 3/1973 | Kuijsten | 340/365 S |
| 4,106,011 | 8/1978 | Melanson et al. | 340/365 E |
| 4,231,016 | 10/1980 | Ueda | 340/365 E |
| 4,231,024 | 10/1980 | Munetsugu | 340/365 S |
| 4,326,194 | 4/1982 | Pepe | 340/365.R |
| 4,408,184 | 10/1983 | Ishii | 340/365 S |
| 4,420,744 | 12/1983 | Jesson | 340/365 E |
| 4,570,154 | 2/1986 | Kinghorn et al. | 340/365 S |
| 4,581,603 | 4/1988 | Ingold et al. | 340/365 E |
| 4,673,933 | 6/1987 | Bauer | 340/825.94 |

OTHER PUBLICATIONS

IBM Technical Disclosure Article by Bland and Bolt, vol. 27, No. 4A, Sep. 1984.

*Primary Examiner*—Donald J. Yusko
*Assistant Examiner*—Tyrone Queen
*Attorney, Agent, or Firm*—John J. McArdle, Jr.

[57] ABSTRACT

A matrix keyboard system for producing key codes in response to the actuation of key switches. The keyboard system includes ghost key condition detection. In the keyboard system, a group of parallel drive lines and a group of orthogonal parallel sense lines form a matrix, with a key switch being associated with each of the intersection points on the matrix. The drive lines are sequentially activated, and the actuation of a key switch along an activated drive line results in the coupling of a drive signal to the associated sense line. A ghost key condition arises when three of the four corners of a notional rectangle in the matrix contain an actuated key switch. The ghost key condition detector senses the presence of drive signals not only on the sense lines but also on the drive lines, with a ghost key condition being identified if a drive signal is sensed on two or more sense lines and two or more drive lines simultaneously.

6 Claims, 7 Drawing Sheets

KEYBOARD ARRANGEMENT WITH GHOST KEY CONDITION DETECTION

FIELD OF THE INVENTION

This invention relates generally to keyboard systems and more particularly concerns such systems which include ghost key condition detection.

BACKGROUND OF THE INVENTION

Many devices such as musical instruments, calculators, and electronic typewriters receive input information through keyboards. Keyboard systems in such devices sense the depression or other actuation of keys in various ways. One way, which is often employed in electronic typewriter and personal computer keyboards, is the use of a key switch matrix, as illustrated diagrammatically in FIG. 1.

In the illustrated example, conductors 11-17 serve as drive lines, and conductors 18-22 serve as sense lines. The drive lines and sense lines are electrically isolated from one another but can be coupled together by the actuation (closure) of key switches such as 23 and 25 located at the crossover locations of the drive and sense lines. Such switches are shown somewhat less diagrammatically in FIG. 2.

Returning to FIG. 1, each of the drive lines 11-17 is strobed with a drive signal in sequence, and the sense lines 18-22 are sensed for the coupling of the drive signal through an actuated switch such as the switch 25. For example, if a drive signal is applied to the drive line 16, and the key switch 25 is closed, the drive signal is coupled to the sense line 21. Based upon the drive line which is driven and the sense line receiving the drive signal, a precise determination is made of the identity of the actuated key switch.

Certain problems arise in matrix keyboards such as that of FIG. 1 when multiple switches are closed simultaneously. One such problem occurs when certain combinations of three or more switches are simultaneously actuated. In that case, it may appear (erroneously) that additional (unclosed) switches are also actuated. For example, if certain configurations of three switches are actuated, it appears that four switches are actuated, and it is impossible to determine which of the detected actuations is falsely indicated.

This is referred to as a phantom, or ghost, key condition. To illustrate, in FIG. 1 assume that key switches 24, 26 and 27 are closed. When a drive signal is applied to the drive line 12, the signal is coupled through the switch 24 to the sense line 19 and through the switch 26 to the sense line 20. This provides an indication that key switches 24 and 26 are closed. When the drive line 14 is driven, the drive signal is coupled through the switch 27 to the sense line 19, indicating that the key switch 27 is closed. However, when the drive line 14 is driven, the drive signal is also coupled through the switch 27, the sense line 19, and the switch 24 to the drive line 12. From there the drive signal is coupled through the switch 26 to the sense line 20. Therefore, it appears that the switch 28 is closed and being driven by the drive line 14 while, in reality, the switch 28 is open. It has been noted in arrays such as that of FIG. 1 that if there are three switches actuated at the corners of a notional rectangle within the array, the switch at the fourth corner of the rectangle appears to be actuated.

In the past, one way that ghost key conditions have been prevented is by supplying diodes for each of the key switches to prevent the reverse coupling of a drive signal from a sense line onto another (undriven) drive line. Another type of matrix keyboard uses scaling elements such as resistors along each line between each of the crossover points so that a spurious drive signal is attenuated and recognized as false on the sense line where it is detected. The cost of such approaches includes the costs of procurement, installation and testing of all of the additional components which must be placed in the matrix.

Alternatively, in order to avoid the expense of additional components and to use simple key switch matrices such as that of FIG. 1, control schemes have been implemented to look for situations where multiple keys are actuated and to disregard the key switch actuation indications which are sensed. For example, with reference again to FIG. 1, in one such approach the results of applying a drive signal to each of the drive lines 11-17 in sequence are stored in a memory device or register. An algorithm is then applied to the results, and the results are disregarded if the ghost key definition of the algorithm is met.

For example, it may be decided that if two switches such as 24 and 27 are actuated on a single sense line 19 (as determined based upon storing the results from driving the drive line 12 and from driving the drive line 14), all sensed key switches from that drive line scan sequence are to be disregarded. A more restrictive algorithm might call for disregarding a set of key switch indications only where, for example, not only switches 24 and 27 were actuated but also another switch on another sense line. The ghost key detection algorithm could call for disregarding key switch actuation indications in various other defined situations.

Generally, in these prior techniques for detecting a ghost key condition, there is a delay associated with processing the results of a sequence of drive line activations before reaching a conclusion as to the presence or absence of a ghost key condition. Further, many of the prior algorithms employed in ghost key detection result in disregarding multiple keystrokes in situations where a ghost key condition does not truly exist.

SUMMARY OF THE INVENTION

It is the general aim of the invention to provide virtually instantaneous ghost key condition detection in matrix keyboards of the foregoing type.

In carrying out the invention, more lines than merely the sense lines of the matrix are sensed in response to the actuation of a drive line. In one embodiment of the invention, the ghost key condition detection takes the form of simultaneously sensing both the sense lines and the drive lines in a rectangular matrix array such as that shown in FIG. 1. The simultaneous presence of drive signals on more than one sense line and of drive signals on more than one drive line indicates the existence of a ghost key condition.

Further objects and advantages of the invention will become apparent upon reading the following detailed description and upon reference to the drawings.

DETAILED DESCRIPTION

Figure 1:
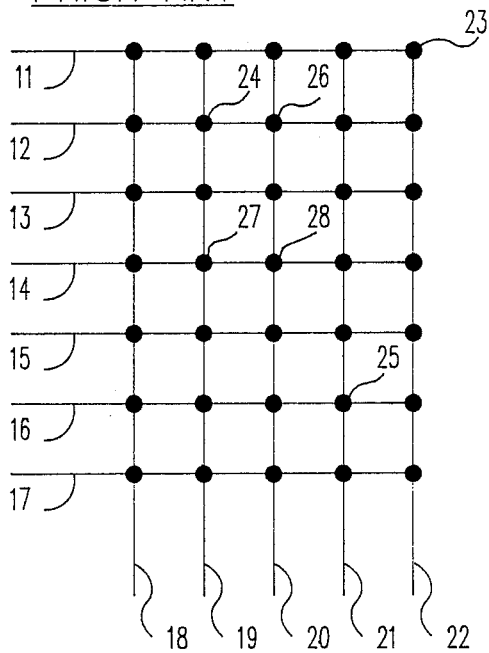
FIG. 1 is a diagrammatic illustration of a form of matrix keyboard.
Figure 2:
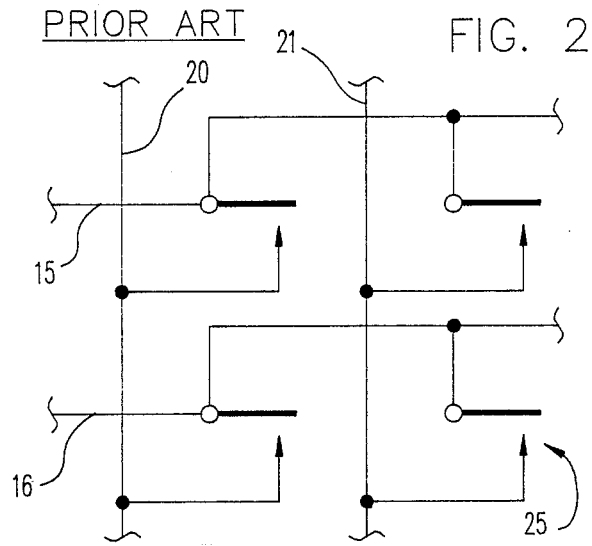
FIG. 2 is a more detailed illustration of a portion of FIG. 1 showing illustrative key switches.

While the invention is susceptible to numerous modifications and alternative forms, a specific embodiment of the invention has been shown by way of example in the drawings and will be described herein in detail. It should be understood that it is not intended to limit the invention to the particular form disclosed, but, on the contrary, the intention is to cover all modifications, equivalents, and alternatives falling within the spirit and scope of the invention as defined by the appended claims.

Figure 3:
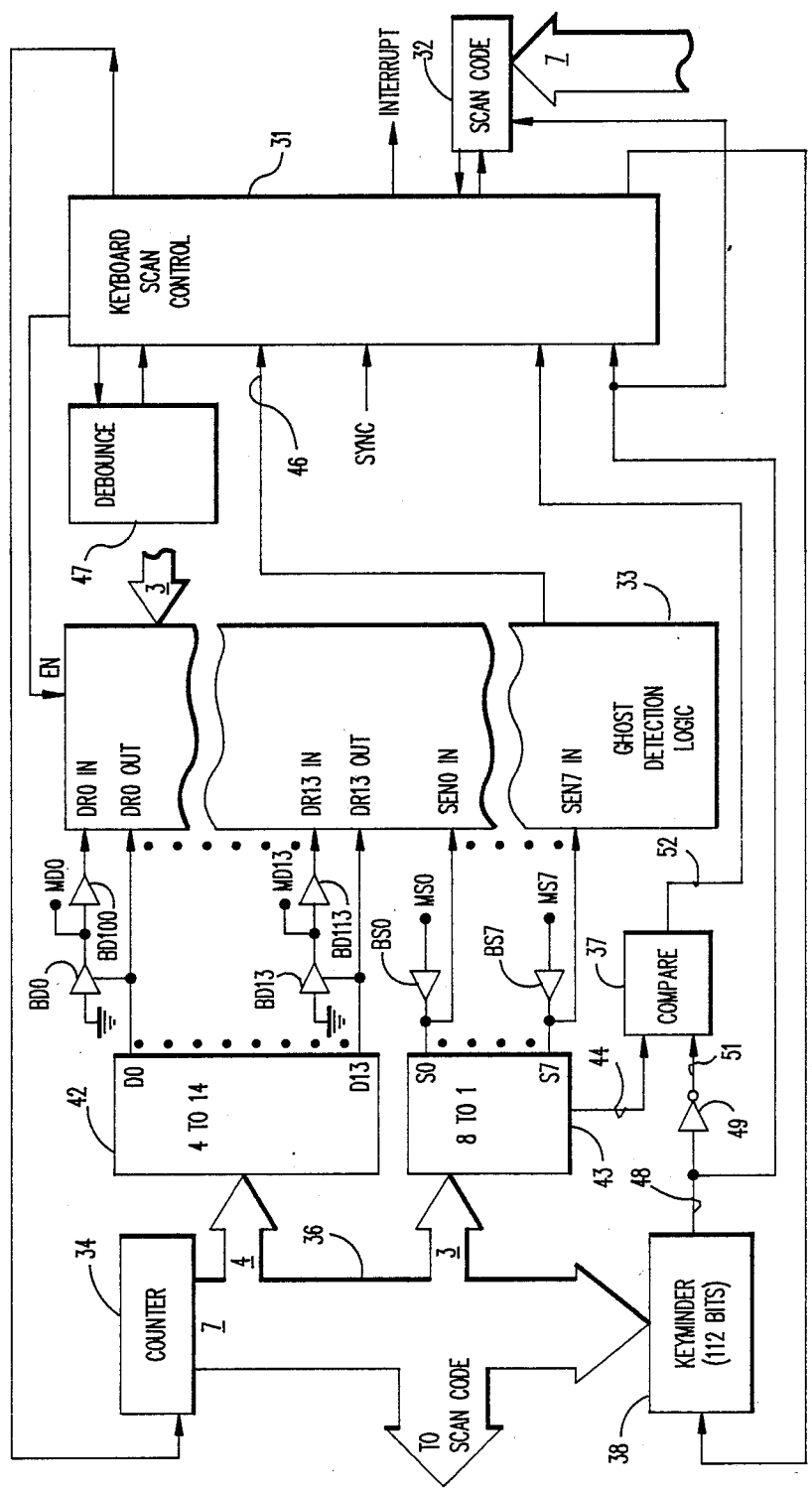
FIG. 3 is a block diagram of a keyboard arrangement including ghost key condition detection in accordance with the present invention.

With reference now to FIG. 3, in a typing system keyboard control arrangement 30 a keyboard scan control circuit 31 controls the application of drive signals to a group of keyboard matrix drive lines MD0–MD13. A group of keyboard matrix sense lines MS0–MS7 are sensed in coordination with the application of the drive signals to the selected drive lines. The actuation of a key switch in the keyboard matrix 41 (FIG. 4) results in the output of a scan code representative of that key switch and its current state by the scan control unit 31 to a scan code, or key code, register 32. In coordination with the operation of the keyboard scan control unit 31, a ghost key detection circuit 33 monitors both the drive lines and the sense lines to detect any ghost key conditions. If a ghost key condition is detected by the ghost detection logic unit 33, a signal is sent to the keyboard scan control 31 to inhibit the output of scan codes to the register 32 until the ghost condition is no longer present, and to inhibit further scanning of the keyboard matrix.

In the illustrated keyboard arrangement, the keyboard scan control 31 increments a counter 34. The binary value in this counter is a seven bit address carried on a bus 36. The three low order bits (those changing most frequently) are used to select a sense line MS0–MS7 from the keyboard matrix, and the four high order bits are used to select a drive line MD0–MD13 in the keyboard matrix which is to be activated.

For any given address on the bus 36, a particular one drive line is activated and a particular one sense line is sensed. The pairing of this drive line and this sense line corresponds to one particular key switch in the matrix. The one particular drive line being activated is referred to as the "current drive line". The one particular sense line being sensed is referred to as the "current sense line". The corresponding key switch is the "current key".

The value of the current sense line represents the current state of the current key switch (open or closed). The current state of the switch is compared with the prior state of the switch by the compare circuit 37. This prior state information is stored in a random access memory 38, referred to herein as the keyminder. The keyminder 38 stores 112 bits of information corresponding to the 112 keys in the key matrix (14 drive lines by 8 sense lines).

In order to provide ghost key detection, the ghost detection logic unit 33 receives inputs from all of the drive lines and all of the sense lines. For each key switch which is checked in the compare circuit 37 and found to be validly closed, the ghost detection logic makes a ghost key determination based upon the state of the driven drive line and the other drive lines as well as the state of the selected sense line and the other sense lines. The determination which is made is: if both (A) at least two drive lines are active and (B) at least two sense lines are active, then a ghost key condition exists. In this event a ghost detection signal is supplied to the keyboard scan control unit 31 to inhibit the output of a scan code for the current key.

Figure 4:
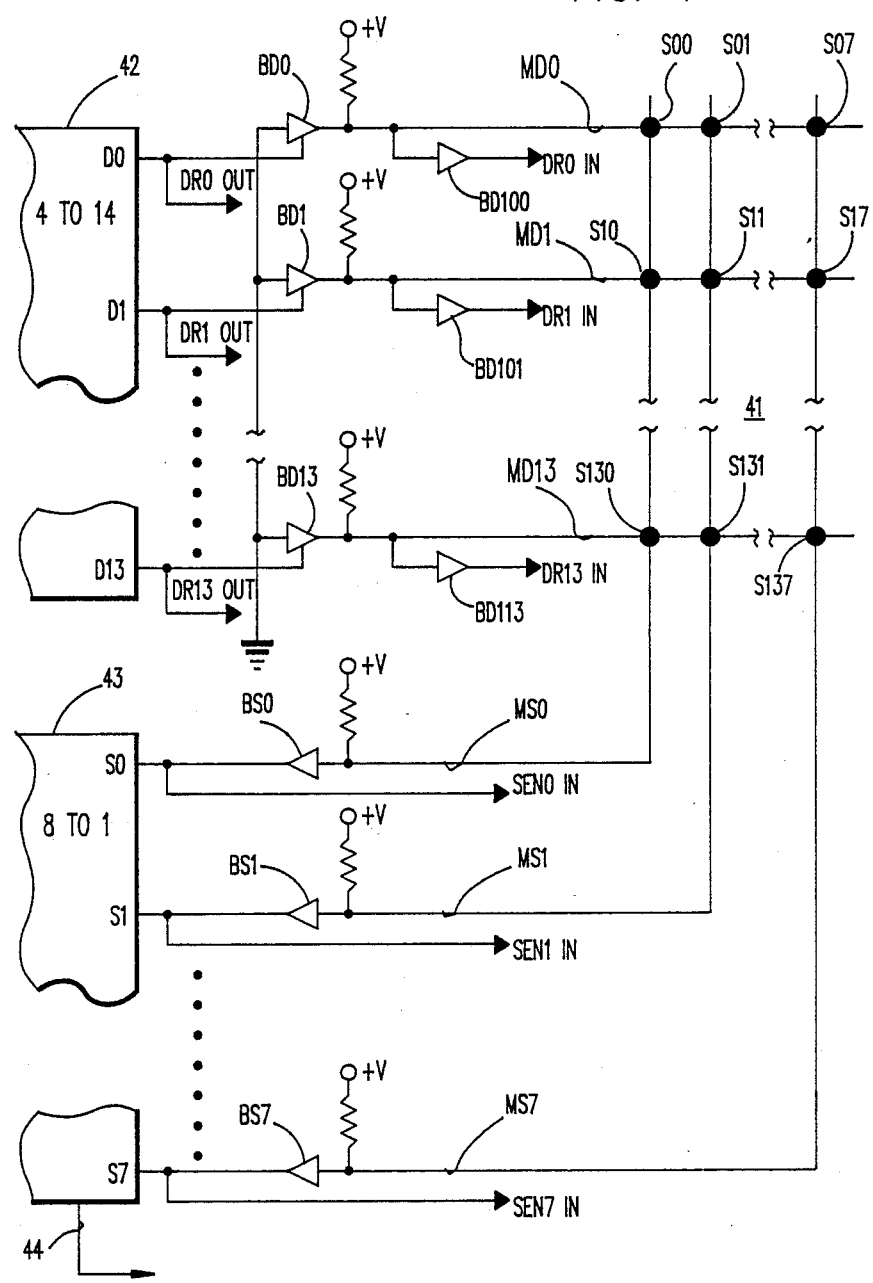
FIG. 4 is an illustration of exemplary connections from the keyboard arrangement of FIG. 3 to a key switch matrix.

Considering the keyboard control arrangement 30 and the drive lines and sense lines in more detail, and with additional reference to FIG. 4 showing an exemplary portion of the keyboard matrix 41 connected to the keyboard control arrangement, the four high order bits from the address bus 36 are input to a four-to-fourteen decoder 42, which applies a logic high to one of the fourteen outputs D0–D13 of the decoder 42. The outputs D0–D13 of the decoder 42 are coupled to the DR0 OUT–DR13 OUT inputs to the ghost detection logic unit 33. The outputs of the decoder 42 are also coupled to "enable" inputs of a group of buffers BD0–BD13. The inputs to these buffers are grounded, and the buffer outputs are the keyboard matrix drive lines MD0–MD13. The matrix drive lines MD0–MD13 are coupled through buffers BD100–BD113 to the DR0 IN–DR13 IN inputs to the ghost detection logic unit 33.

Each of the matrix drive lines MD0–MD13 are held up at a logic high by a voltage +V applied through pull-up resistors. The pull-up resistors can be connected adjacent the buffers (as shown) or in the matrix 41 or both.

As an example of the operation of the drive lines, if the D0 output of the decoder 42 is selected, a logic high is output at that terminal. This logic high is connected to the DR0 OUT terminal of the ghost detection logic circuit 33. The logic high is also connected to the enable terminal of the buffer BD0. This passes the ground (logic low) from the input of the buffer BD0 to its output, applying a low voltage to the drive line MD0.

The matrix sense lines MS0–MS7 are connected through buffers BS0–BS7 to the S0–S7 inputs of an eight-to-one multiplexer 43. The multiplexer circuit 43 selects one of the eight sense line inputs based upon the three bit binary code defined by the three low order bits of the bus 36. The logical state of the selected sense line is on input 44 to the compare circuit 37.

The sense lines MS0–MS7 from the keyboard matrix 41 are normally at a logic high due to a positive voltage +V applied through pull-up resistors to the sense lines. A sense line MS0–MS7 to which a drive signal is coupled is brought to ground, or a logic low. The inputs S0–S7 to the multiplexer 43 are also connected to the terminals SEN0 IN–SEN7 IN of the ghost detection logic unit 33.

If a keyboard matrix sense line is driven low by the closure of a key switch connected to a drive line which has been driven low, this logic low is coupled to both the associated input of the multiplexer 43 and the associated input of the ghost detection logic unit 33. For example, if the drive line MD0 is driven low, and the switch S00 is closed, this logic low drive signal is coupled to the sense line MS0. This logic low is passed through the buffer BS0 to the S0 input of the circuit 43 and to the SEN0 IN input of the ghost detection logic unit 33.

The ghost detection logic unit 33 receives the above-mentioned DR0 IN-DR13 IN, DR0 OUT-DR13 OUT, and SEN0 IN-SEN7 IN inputs and is also connected to the three low order bits of the address bus 36. The ghost detection logic unit 33 uses these inputs to determine if two or more drive lines and two or more sense lines are simultaneously low to decide if a ghost key condition exists. The precise logic gate arrangement within the ghost detection logic circuit 33 is described subsequently.

If the above-mentioned conditions exist, a ghost key detection signal is provided on the line 46 to the keyboard scan control 31. A general description of the operation of the present form of the keyboard scan control unit 31 shall now be given in order to delineate the interaction between the keyboard scan control 31 and the ghost detection logic 33. A number of keyboard scan control units can be utilized with the present ghost detection logic, and the keyboard scan control will be described herein substantially only to the extent necessary to permit an understanding of its interaction with the ghost key detection logic unit 33. For clarity in FIG. 3, not all connections among the scan control 31, the counter 34, the keyminder 38, and the other circuits are illustrated. Thus, such connections as those for many of the resets, clock signals, power inputs and the like are not shown.

Figure 5:
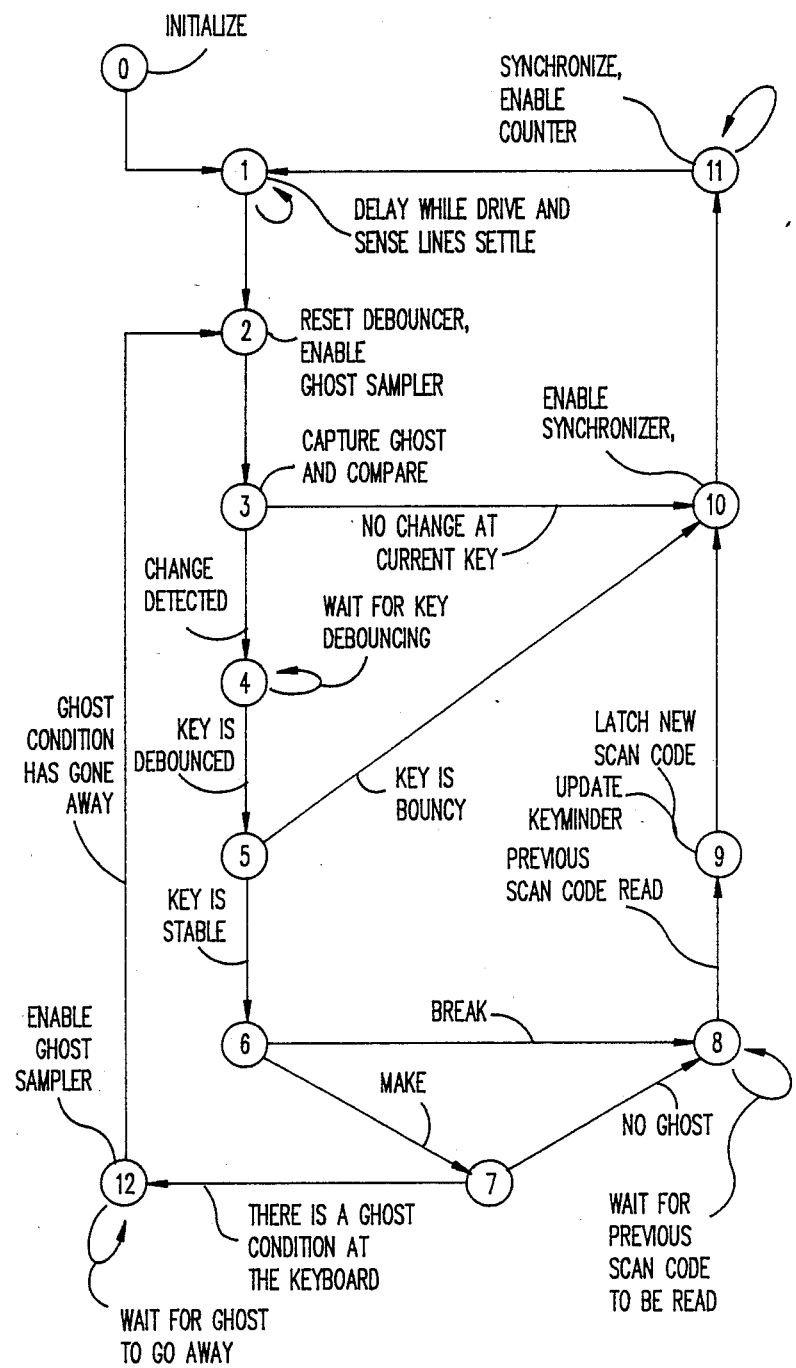
FIG. 5 is a state diagram for the operation of the keyboard scan control unit of FIG. 3.

The keyboard scan control 31 can be implemented in the form of, for example, sequential logic or a programmed microprocessor. In the present instance, the keyboard scan control 31 is implemented in logic in the form of a sequential, or finite state, machine. A state diagram for the keyboard scan control 31 is shown in FIG. 5. The operation of the keyboard scan control 31 in cooperation with the ghost key detection logic circuit 33 shall now be described in conjunction with FIGS. 3 and 5.

In operation, the keyboard scan control 31 initializes itself when power is applied to the keyboard. At this power-on reset, the keyboard scan control resets the counter 34 and effects other necessary initializations. The scan control then waits for a synchronization pulse to enable it to advance to state 1 (FIG. 5). The synchronization (sync) pulse is a clock pulse provided at a rate to permit the optimum scanning of the keyboard in light of the speed of keying by an operator. Once the sync pulse is received, the scan control advances to state 1 on the next system clock pulse, which occurs at a considerably higher rate than the sync pulse rate. The scan control then starts looping through the steps shown in the state diagram and executes this loop until the keyboard is powered off. In the absence of a "wait" or a delay in a given state, the scan control generally advances from state to state based upon system clock pulses.

The control first delays (in state 1, for the duration of the sync pulse) while the drive and sense lines settle, and then (state 2) resets the debounce circuit 47 and enables the ghost detection logic circuit 33.

In the next state (state 3), the ghost detection signal, if any, is clocked onto the line 46 from the ghost detection logic unit 33. At this time, the keyboard scan control 31 freezes the signal on the line 46 by removing the enable signal from the ghost detection logic.

The keyminder 38 places the stored value of the current key (determined by the address on the bus 36) on a line 48 to couple that value to the compare circuit 37.

The current key is the key switch at the physical intersection of the current drive line and the current sense line. The current drive line is being driven low in the manner previously described. Immediately after initialization, the current key is the key S00, the key at the intersection of drive line MD0 and sense line MS0.

In the present instance, if the addressed bit in the keyminder is low, then previously the current key was released. Initially the keyminder data indicates that all keys are released. If the addressed bit is a logic high, that indicates that previously the current key was pressed. In the illustrated arrangement, the previous key value is inverted by an inverter 49, and the output 51 of the inverter 49 is coupled to the compare circuit 37. The signal on the line 51 is at a logic low if the key was previously depressed, and at a logic high if the key was previously released. The input on the line 44 to the compare circuit 37 from the sense line selector 43 is at a logic low if the key is now depressed and at a logic high if the key is now released. If the two inputs to the compare circuit 37 are different there has been a change in the condition of the current key. The compare circuit 37 provides a signal on the line 52 to the scan control 31 which tells whether or not there has been a change in the state of the current key.

In state 3, the scan control unit "reads" the logic level of the output line 52 from the compare circuit 37. If the state of the current key, as reflected by the signal on the line 52, has not changed, the scan control moves to the state 10 and resets an internal sync pulse flip flop (not shown). The scan control then (state 11) waits for a sync pulse and enables the scan counter 34 to increment to the next key address. The counter increments on a subsequent system clock pulse. The control 31 returns to state 1 when it receives a sync pulse and begins the loop for a new current key.

If, (at state 3) a change in key condition is recognized based upon the signal on the line 52, the scan control 31 then (state 4) waits for the switch to be debounced by the debounce circuit 47. The compare output signal on the line 52 is reread as required by debounce criteria in the debounce circuit to determine if there has been a true change in state of the key. After the key is debounced (state 5), if the key has not met the debounce criteria, the control goes to state 10 and proceeds as previously described.

If the debounce criteria establish that the key state is stable, the control 31 determines (state 6) if the key change is a make or a break of the key. The line 48 from the keyminder 38 is input to the control 31 and is at a logic low if the current key previously was released and at a logic high if the key previously was made. Since there has been a change, a logic low on the line 48 is interpreted by the control as a "make" and a logic high on the line 48 is interpreted as a "break" of the current key.

If the change to the current key is a break, the control 31 (state 8) waits, if necessary, for a microprocessor or other external device (not shown) to read the previous scan code from the scan code register 32. When the scan control 31 knows that any scan code previously placed in the scan code register 32 has been read, the control latches the new scan code into the register 32 and asserts an interrupt to the microprocessor (state 9) to read the new scan code. The scan code sent to the microprocessor contains eight bits, seven of which are the current key address. The eighth bit is a logic zero for a make or a logic one for a break. The eighth bit value is derived from the logic state of the line 48 from the keyminder. At the state 9, the scan control also toggles the stored bit for the current key in the keyminder 38 to reflect the "make" or "break" which has occurred. The scan control then moves to the state 10 and proceeds as previously described.

From the state 6, if there has been a key "make" rather than a "break", the scan control 31 reads the "ghost" signal from the ghost detection logic output line 46. If there is no ghost condition indicated, the control moves to the state 8 and proceeds as previously described.

If there is a ghost key condition detected, the scan control moves to the state 12 and re-enables the ghost detection logic circuit 33. The signal on the line 46 from the ghost detection logic circuit 33 is then read on successive clock cycles until the ghost condition is no longer present. Once this has occurred, the scan control returns to state 2, and proceeds as previously described. The counter 34 is not incremented at this time, and the current key remains the same.

With reference now to FIG. 6, the logic circuitry in the ghost detection logic unit 33 implements the detection of the conditions (A) at least two drive lines active and (B) at least two sense lines active, where a ghost key condition exists if and only if both of those statements are true. The gate arrangement in FIG. 6B supplies an output indicative of the drive line condition (A), and the gates in FIGS. 6A and 6D provide outputs which, when combined, determine the condition (B) for the sense lines. The true or false conditions of the two statements (A) and (B) are combined in the circuitry of FIG. 6C to provide the ghost key detection signal on the line 46 out of the ghost detection logic unit 33 of FIG. 3.

Figure 6A:
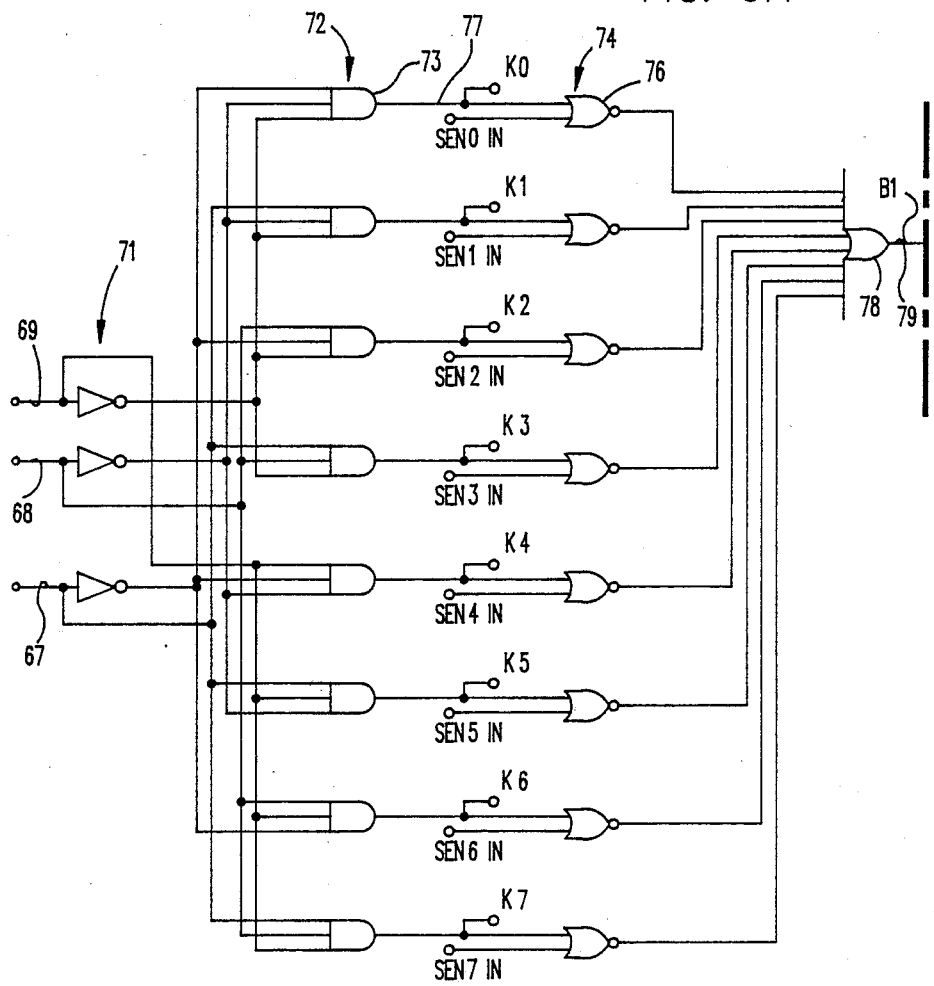
FIGS. 6A–6D combine to form a schematic diagram of the logic circuitry in the ghost detection logic unit of FIG. 3.
Figure 6B:
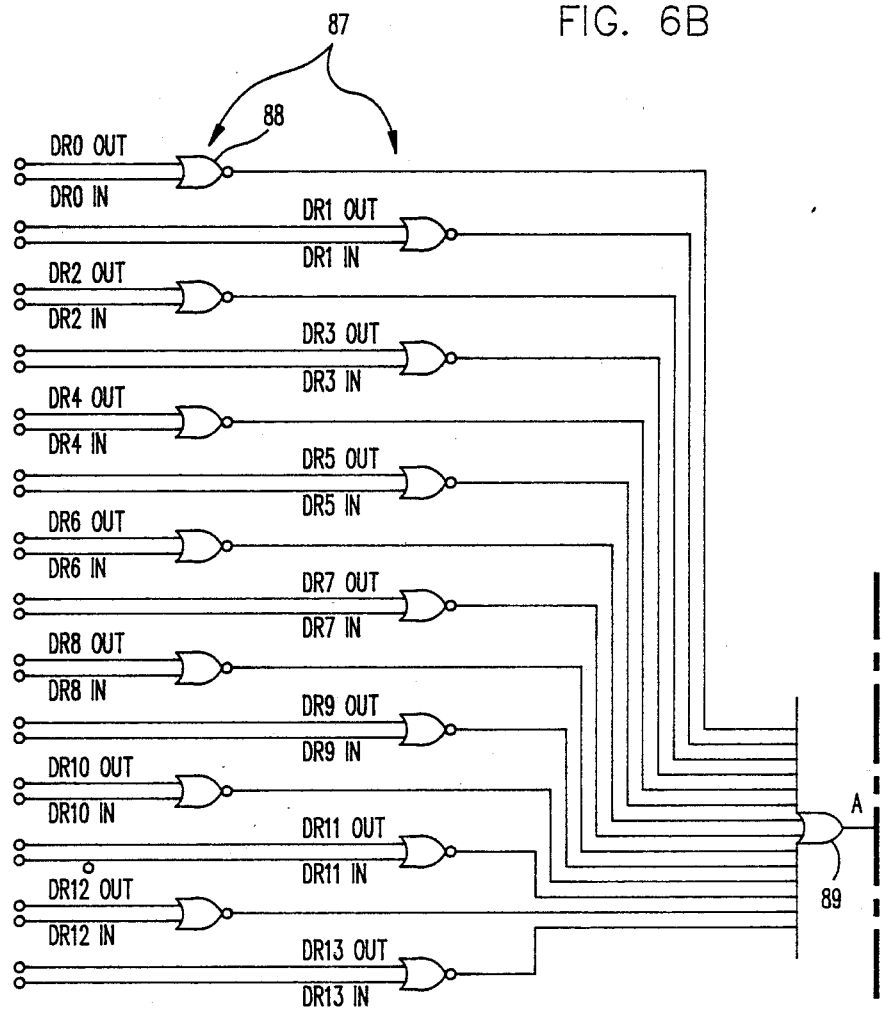
Figure 6C:
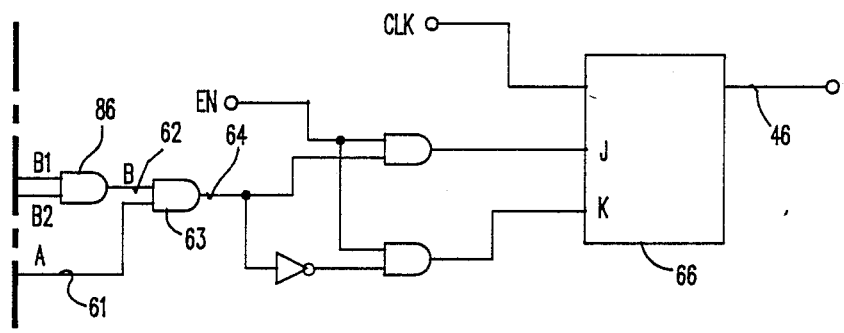

In FIG. 6C, a logic high on the line 61 indicates that at least two drive lines are active. A logic high on the line 62 indicates that at least two sense lines are active. The lines 61 and 62 are the two inputs to an AND gate 63, and therefore if both lines 61 and 62 are high, there is a high output on the line 64, indicating that a ghost key presently exists. The signal on the line 64 is at a logic low if no ghost key exists.

When an enable signal is supplied from the control unit 31, the value on the line 64 is passed to a JK flip-flop 66, to either set or reset the flip-flop. If a ghost key condition exists, line 64 is high, the flip-flop is set, and a logic high appears on the output line 46. If there is no ghost key condition detected, the line 64 is low, the flip-flop 66 is reset, and the output line 46 is low. When the enable signal is removed, the flip-flop is frozen at the most recent state.

Figure 6D:
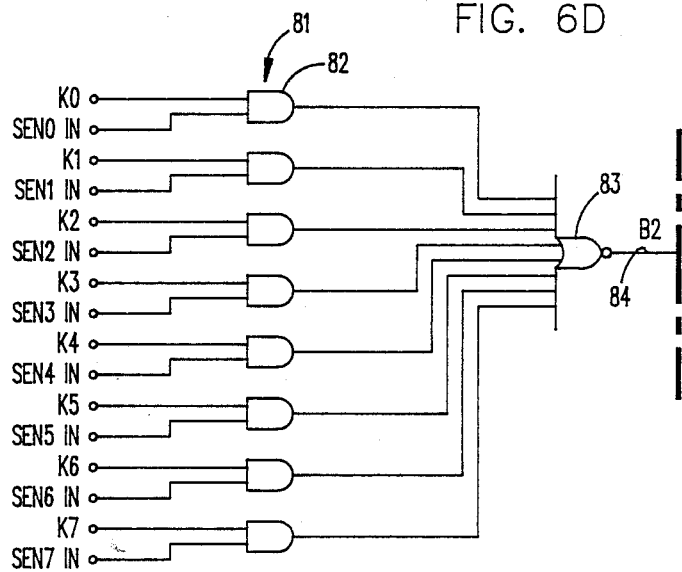

In order to determine if two or more sense lines are active (detected low in the keyboard matrix), the gate circuitry shown in FIGS. 6A and 6D is used. The circuitry of FIG. 6A determines whether one or more sense lines other than the current sense line are active. The circuitry of FIG. 6D determines whether the current sense line is active. The combination of the circuitry of FIG. 6A and FIG. 6D determines if there are at least two sense lines active. Dividing the circuitry into two parts (FIG. 6A and FIG. 6D) provides an efficient implementation of the sense line determination.

To determine which sense line is the current sense line, the three low order bits from the current key address are connected on the lines 67, 68 and 69 (FIG. 6A). The three inverters 71 and the eight three-input AND gates 72 decode the three-bit address on the lines 67, 68 and 69 so that only one of the AND gates 72 has an output at a logic high.

The AND gates 72 are associated (from top to bottom in FIG. 6A) with the sense lines SEN0 IN-SEN7 IN. Thus, for example, if the three bit address on the lines 67-69 is "0 0 0", the three inputs to the AND gate 73 are at a logic high, and its output is high, indicating that the current sense line is the sense line zero. The outputs of the AND gates 72 each form one input to a corresponding one of eight NOR gates 74. In the example of a three bit address of "0 0 0", the input to the NOR gate 76 on the line 77 from the AND gate 73 is high, so the output of the NOR gate 76 is low. The input to each of the other NOR gates from its associated AND gate 72 is low.

If no other sense line is active, the second input to each of the other NOR gates 74 is high. Therefore, in substance the remaining NOR gates are checking for an active sense line, and if one of the other sense lines is active, it is at a logic low so that there are two low inputs to that NOR gate. In such a case, the output of that NOR gate is high.

An OR gate 78 collects all of the NOR gate 74 outputs as inputs, and produces a logic high output on the line 79 if any of its inputs are high. A logic high output on the line 79 indicates that at least one sense line other than the current sense line has been driven to its active state.

Since the ghost key detection circuit 33 is operable not only in response to a key "make" but also at a time when the control unit is continuously checking to see if a ghost key condition has cleared, the continued activation of the current sense line must also be monitored. In other words, if the ghost key condition is cleared by the release of the current key, the ghost key detection circuit must be capable of recognizing that the current key is no longer in a "make" condition.

In order to do this, the two inputs to the NOR gates 74 in FIG. 6A are also coupled to an array of eight AND gates 81 (FIG. 6D). The line, of the group of lines K0-K7, corresponding to the current sense line is at a logic high. The other lines in the group of lines K0-K7 are low. Therefore, continuing with the example (bus address "0 0 0" discussed earlier), the K0 input to the AND gate 82 is high and the inputs K1-K7 to the other seven AND gates are low. Therefore, the seven AND gates associated with inputs K1-K7 are inactive. If the SEN0 IN line to the AND gate 82 remains active, it is at a logic low and the output of the AND gate 82 is also low.

If the sense line SEN0 IN associated with the current key remains active, all of the inputs to a NOR gate 83 from the output of the AND gates 81 are low, and the NOR gate output 84 is high. This logic high indicates that the sense line associated with the current key remains active. In the example, only the AND gate 82 can have an effect on the output of the NOR gate 83. If the sense line SEN0 IN has gone inactive, it is high so that both inputs to the AND gate 82 are high, its output is high, and the output of the NOR gate 83 is low.

With reference again to FIG. 6C, an AND gate 86 receives the inputs B1 and B2, which are the outputs 79 and 84 from the circuits of FIGS. 6A and 6D, respectively. The B1 signal is high if at least one sense line other than the current sense line is active, and the input B2 is high if the current sense line is (still) active. The output of the AND gate 86 on the line 62 is high, therefore, if at least two sense lines are active (one of them being the sense line associated with the current key).

In order to determine if two or more drive lines are active, the DR IN and DR OUT lines (FIG. 3) for each drive line are input to a different NOR gate in a group of NOR gates 87 (FIG. 6B). The DR OUT lines from the four-to-fourteen decoder 42 are normally low, with the drive line associated with the current key being driven high. The DR IN lines are coupled to the matrix drive lines and are normally high, with any active drive line being low.

Therefore, if the drive line associated with the current key is, for example, drive line zero, a NOR gate 88 has one input at a logic high (DR0 OUT) and one input at a logic low (DR0 IN). Therefore, the output of the NOR gate 88 is low.

The DR OUT input to each of the other NOR gates 87 is low (not selected by the decoder 42), and therefore these NOR gates are effectively "enabled". If any drive line is active, its associated DR IN line is low. For a NOR gate other than the NOR gate 88, this results in two logic low inputs to the NOR gate, and the output of the associated NOR gate is high. All of the outputs of the NOR gates 87 serve as inputs to an OR gate 89, whose output is high only if a drive line other than the current drive line is active. Since the current drive line must be active, the detection of one or more additional active drive lines satisfies the condition (A) that at least two drive lines are active.

Returning to FIG. 6C, the second input 61 to the AND gate 63 contains the signal A from the output of the OR gate 89 (FIG. 6B), indicative of the drive line status. If there are two or more active drive lines, the line 61 is high. If the sense line conditions for a ghost key have been met, the input 62 to the AND gate 63 is also high. This produces a logic high on the output 64 of the AND gate 63 and results in a ghost key detection signal (logic high) being clocked to the ghost key detection circuit output 46 when the circuit is enabled.

What is claimed is:

1. A keyboard arrangement, for producing key codes representative of key switches which are actuated in the keyboard arrangement, including ghost key condition detection, comprising:
    a first group of conductors and a second group of conductors in an array;
    means for selectively applying a drive signal to one conductor, in the first group of conductors, at a time;
    a group of key switches, each connected to two different conductors comprising a unique combination of a conductor from the first group of conductors and a conductor from the second group of conductors, and each operable when actuated to electrically couple together its associated two different conductors so that the presence of a drive signal on one said conductor results in the presence of a drive signal on the other said conductor;
    sensing means coupled to the conductors in the second group of conductors for sensing drive signals on said conductors;
    key code means for converting a sensed drive signal to a key code and for supplying the key code at an output; and
    ghost key condition detection means, coupled to the conductors in the first and second groups of conductors, for detecting the simultaneous presence of drive signals on a plurality of conductors in the first group of conductors and of drive signals on a plurality of conductors in the second group of conductors, to inhibit the operation of the key code means.

2. The keyboard arrangement of claim 1 in which the ghost key condition detection means consists essentially of combinational logic devices having inputs defined by the signal states of the first and second groups of conductors.

3. A keyboard arrangement, for producing key codes representative of key switches which are actuated in the keyboard arrangement, including ghost key condition detection, comprising:
    a group of drive lines;
    a group of sense lines;
    means for selectively applying a drive signal to one drive line, termed the current drive line, at a time;
    a group of key switches, each connected to two different lines comprising a unique combination of a drive line and a sense line, and each operable when actuated to electrically couple together its associated two different lines so that the presence of a drive signal on one said line results in the presence of a drive signal on the other said line;
    sensing means coupled to the sense lines for selectively sensing drive signals on the sense lines;
    key code means for converting each such selectively sensed drive signal to a key code and for supplying the key code at a output; and
    ghost key condition detection means, coupled to the drive lines and the sense lines, for sensing the simultaneous presence of drive signals on a plurality of drive lines and of drive signals on a plurality of sense lines, to inhibit the operation of the key code means.

4. The keyboard arrangement of claim 3 in which the sensing means senses one sense line, termed the current sense line, at a time and the ghost key condition detection means is operable to inhibit the operation of the key code means only when the sensing means senses a drive signal on the current sense line.

5. The keyboard arrangement of claim 4 in which the ghost detection means senses the simultaneous presence of drive signals on the current drive line and on one or more additional drive lines and the simultaneous presence of drive signals on the current sense line and on one or more of the other sense lines.

6. The keyboard arrangement of claim 4 which further comprises means for storing data indicative of the presence or absence of a drive signal on the current sense line when it was previously sensed by the sensing means, and in which the ghost key condition detection means is operable to inhibit the operation of the key code means only when the sensing means senses a drive signal on the current sense line and the means for storing has stored data indicating that a drive signal was not previously sensed on the current sense line.

* * * * *